(12) United States Patent
Alva et al.

(10) Patent No.: US 11,044,548 B2
(45) Date of Patent: Jun. 22, 2021

(54) DYNAMIC SPEAKER CHAMBER

(71) Applicant: Intel Corporation, Santa Clara, CA (US)

(72) Inventors: Samarth Alva, Bangalore (IN); Sumod Cherukkate, Bangalore (IN); Sachin Bedare, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/727,854

(22) Filed: Dec. 26, 2019

(65) Prior Publication Data
US 2020/0322714 A1    Oct. 8, 2020

(51) Int. Cl.
*H04R 1/28*     (2006.01)
*H04R 1/02*     (2006.01)
*G06F 1/16*     (2006.01)
*H04R 29/00*    (2006.01)
*H03G 5/16*     (2006.01)

(52) U.S. Cl.
CPC ......... *H04R 1/2811* (2013.01); *G06F 1/1688* (2013.01); *H04R 1/025* (2013.01); *H04R 29/001* (2013.01); *H03G 5/165* (2013.01); *H04R 2499/11* (2013.01)

(58) Field of Classification Search
None
See application file for complete search history.

(56) References Cited

U.S. PATENT DOCUMENTS

| | | | | |
|---|---|---|---|---|
| 5,732,140 | A * | 3/1998 | Thayer | G06F 1/1616 |
| | | | | 181/154 |
| 8,369,561 | B2 * | 2/2013 | Bhutani | H04R 5/02 |
| | | | | 381/395 |
| 9,367,090 | B2 * | 6/2016 | Barnett | G06F 1/1628 |
| 10,524,033 | B2 * | 12/2019 | Vaturi | G06F 1/1616 |
| 2010/0210327 | A1 * | 8/2010 | Kim | H04M 1/035 |
| | | | | 455/575.3 |
| 2015/0049895 | A1 * | 2/2015 | Walter | H04R 1/02 |
| | | | | 381/345 |

* cited by examiner

*Primary Examiner* — Paul W Huber
(74) *Attorney, Agent, or Firm* — Schwabe, Williamson & Wyatt, P.C.

(57) ABSTRACT

In one embodiment, a portable computing device is described. The portable computing device includes a first surface comprising at least one user interface. The portable computing device also includes a second surface opposite the first surface. Further, the portable computing device includes at least one speaker port in the first surface. Further yet, the portable computing device includes a collapsible speaker chamber configured on the second surface opposite the at least one speaker port. Moreover, the portable computing device includes a speaker configured in the portable computing device between the speaker port and the collapsible speaker chamber.

13 Claims, 13 Drawing Sheets

DYNAMIC SPEAKER CHAMBER

BACKGROUND

The present disclosure relates to speaker assemblies, and in particular, to collapsible speaker back chambers systems and methods of their operation.

Computing devices such as those made for mobility are being made more thinly and to have smaller form factors. Some of the devices that have seen a decrease in their thickness include laptops, tablets, phablets, mobile phones, gaming consoles, and all-in-one (AIO) devices, among others. The movement toward thinner devices has been driven by consumer demand and made possible by advances in chip design, semiconductor fabrication, materials science, memory technology, and battery technology, and the like. These advances make it so that performance of the computing devices is not sacrificed even as devices are made to be thinner and thinner.

One the exceptions, however, is the performance of the built-in speakers of the computing device. For example, as devices are being made to be thinner, speaker back chambers are likewise shrinking in volume. The decrease in speaker back chamber volume results in loss in overall volume or loudness of the device's speakers as well as degradation of low frequency responses.

The present disclosure provides systems and methods for improving the audio intensity and quality of speakers on devices used for mobile computing.

SUMMARY

In one embodiment, a portable computing device is described. The portable computing device includes a first surface. In some embodiments, the first surface comprises at least one user interface. The portable computing device also includes a second surface opposite the first surface. In some embodiments, the second surface comprises at least one user interface. Further, the portable computing device includes at least one speaker port in the first surface. Further yet, the portable computing device includes a collapsible speaker chamber configured on the second surface opposite the at least one speaker port. Moreover, the portable computing device includes a speaker configured in the portable computing device between the speaker port and the collapsible speaker chamber.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

Figure 1:
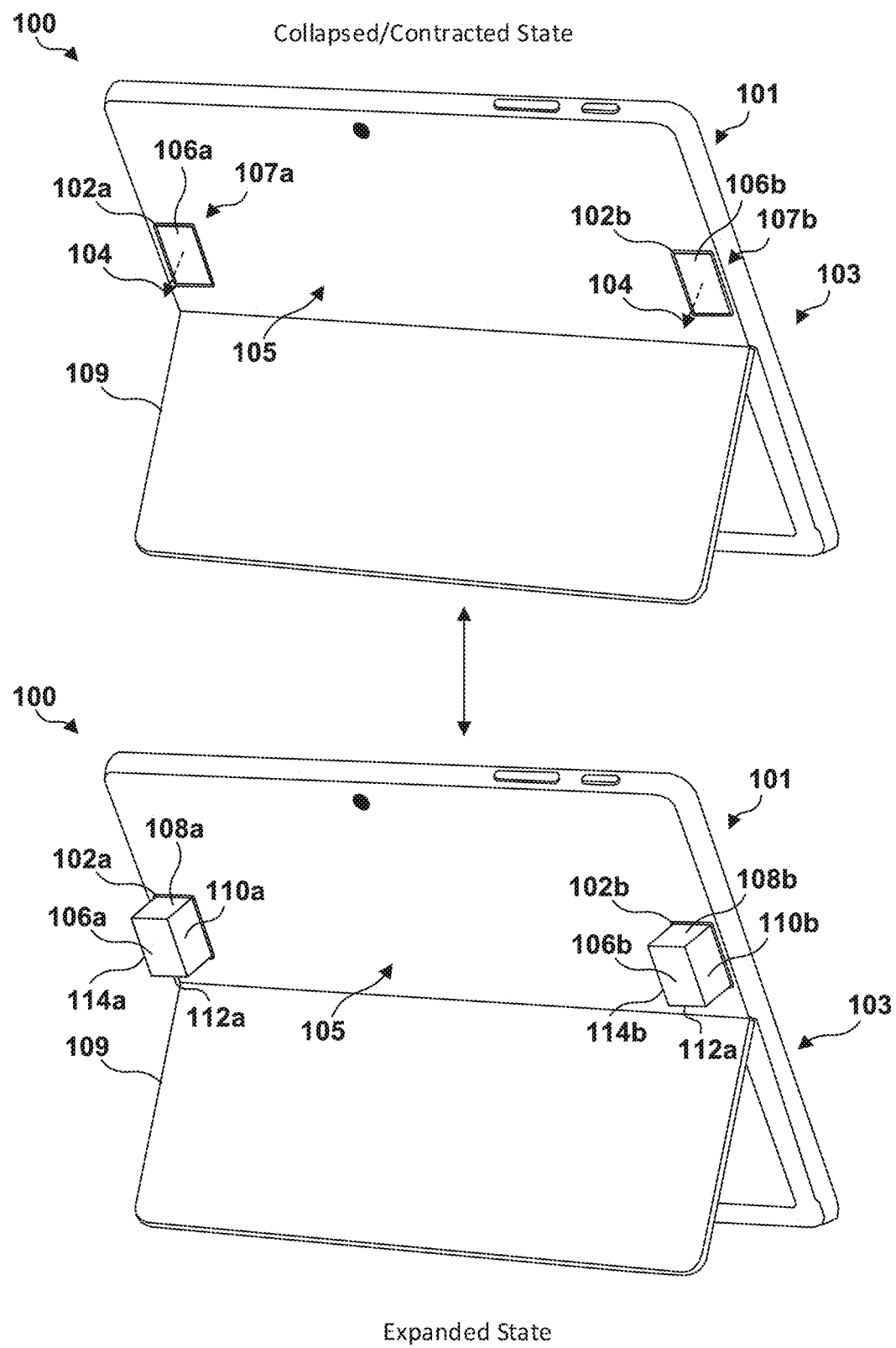
FIG. 1 illustrates a computing device having a pair of collapsible speaker chambers that transitions between a collapsed state and an expanded state, according to one embodiment.

FIG. 1 illustrates a computing device 100 having a pair of collapsible speaker chambers 102*a* and 102*b* that transitions between a collapsed state and an expanded state, according to one embodiment. The computing device 100 is shown to have a first surface 101 (e.g., the "front") and a second surface 105 (e.g., the "back"). The first surface 101 may comprise at least one user interface 103 such as a display, a touchscreen, or a keyboard that generally faces the user. A stand 109 is shown to be coupled to the second surface 105 that enables the computing device 100 to remain upright while the user interacts with the computing device 100. The stand 109 may be coupled to the second surface 105 via a hinge or other hinging, bending, or folding mechanism.

The computing device 100 is shown to include two speaker assemblies 107*a* and 107*b*, which include speaker drivers (not shown) and collapsible speaker chambers 102*a* and 102*b*. The speaker assemblies 107*a* and 107*b* are disposed between the first and second surfaces 101 and 105 when the computing device 100 is in the collapsed state. For example, each of the components of the speaker assemblies 107*a* and 107*b* such as the speaker driver, circuits, wiring, speaker grille, and collapsible speaker chamber 102*a* and 102b do not protrude from either the first surface 101 or second surface 105. In this manner, the speaker assemblies 107a and 107b do not interfere with or protrude outside of the form factor of the computing device 100.

The form factor of a device may be understood to be as those external surfaces tending establish the persistent metes and bounds of the device, for example. The second surface 105, for example, forms a part of the form factor of the computing device 100 when the collapsible speaker chamber 102a is in the collapsed state. In the embodiment shown, the collapsible speaker chamber 102a includes a flat surface 106a that forms a portion of the walls of the enclosure of the collapsible speaker chamber 102a. According to the embodiment shown, when the collapsible speaker chamber 102a is in the collapsed state, the flat surface 106a may be either flush with or recessed into the second surface 105 such that the collapsible speaker chamber 102a does not protrude from the second surface 105. As a result, the form factor of the computing device 100 may be defined in part by the flat surface 106a when the collapsible speaker chamber 102a is in the collapsed state.

For example, the collapsible speaker chamber 102a is "inside" of the form factor of the computing device 100 when the collapsible speaker chamber 102a is in the collapsed state. It is not until the collapsible speaker chamber 102a is in the expanded state does the collapsible speaker chamber 102a expand outside of the form factor. In this fashion, the collapsible speaker chamber 102a does not interfere with the use of the computing device 100, for example, when the computing device 100 is in transport. Additionally, the collapsible speaker chamber 102a is prevented from experiencing damage from external forces. The same is true of collapsible speaker chamber 102b.

As shown in FIG. 1, the collapsible speaker chamber 102a expands in direction 104 that opposes the direction the user interface 103 faces, for example. When the collapsible speaker chamber 102a is expanding to the expanded state, a portion of the collapsible speaker chamber 102a protrudes from the second surface 105, for example. The collapsible speaker chamber 102a is shown to have a plurality of sides 108a-114a that expand in their height along direction 104. As will be discussed in further detail, the plurality of sides 108a-114a comprise an expanding material that enables the collapsible speaker chamber 102a to expand. The same is true of collapsible speaker chamber 102b. In other embodiments, the speaker chamber 102a may expand from the first surface 101 and not the second surface 105. For example, if there is a user interface on surface 101, then the speaker chambers 102a and 102b may expand from the same surface that the user interface is defined on.

Although FIG. 1 illustrates the computing device 100 device to be a tablet or an AIO device, the computing device 100 may also be some other mobile or portable computing device such as a mobile phone, a laptop, a phablet, a gaming console, and the like.

Figure 2:
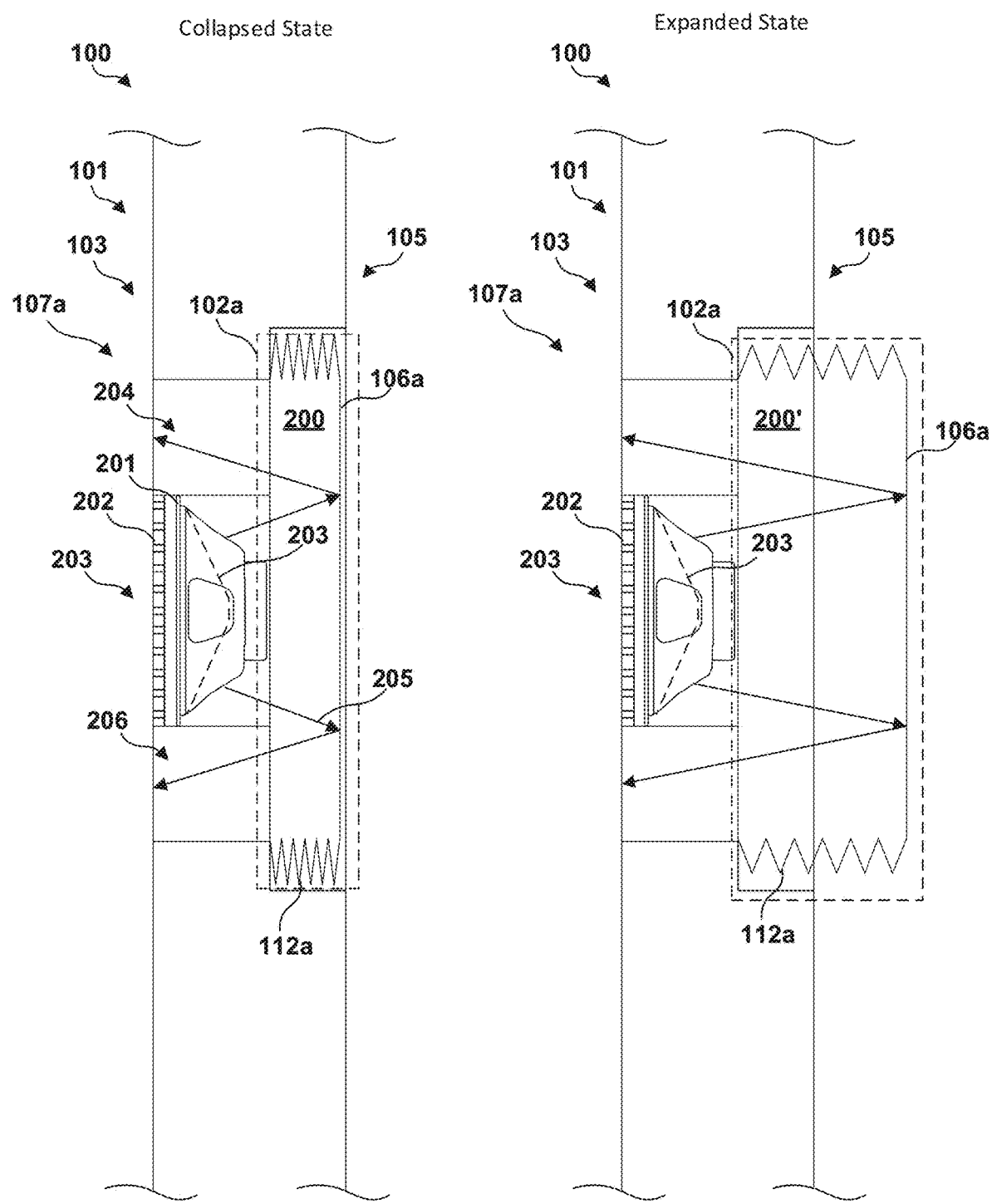
FIG. 2 shows a cross-sectional view of the computing device such as that shown in FIG. 1, according to one embodiment.

FIG. 2 shows a cross-sectional view of the computing device 100 such as that shown in FIG. 1, according to one embodiment. The computing device 100 is shown to have a speaker assembly 107a with a collapsible speaker chamber 102a in a collapsed state in the left-hand side of FIG. 2 and in an expanded state in the right-hand side. According to the embodiment shown, the speaker assembly 107a includes a speaker driver 201 facing the first surface 101 and away from the second surface 105, for example. In this manner, the speaker driver 201 faces the user when the user interacts with the user interface 103 of the first surface 101, for example. The speaker driver 201 may be any type of transducer that converts an electrical audio signal to sound waves. In some embodiments, the speaker driver 201 may include a diaphragm 203 that moves fore and aft to create sounds waves that travel away from diaphragm (e.g., from the speaker driver 201 toward the user).

In the embodiment shown, a grille 202 is disposed between the first surface 101 and the and the speaker driver 201. In certain embodiments, the grille 202 may define a portion of the first surface 101, for example (e.g., the grille 202 may be flush with the rest of first surface 101). The grille 202 is shown in include a plurality of port holes 203 that enable the sound waves produced by the speaker driver 201 to travel toward the user.

The speaker assembly 107a is also shown to include a first side chamber 204, a second side chamber 206 and the expandable speaker chamber 102a. The first side chamber 204 and the second side chamber 206 may be open to the collapsible speaker chamber 102a such that the effective back chamber volume of the speaker assembly 107a is the sum of the volumes of the first side chamber 204, the second side chamber 206, and the collapsible speaker chamber 102a. An example path 205 of a sound wave is shown to originate at the back side of the diaphragm 203 of the speaker driver 201 and to travel into the collapsible speaker chamber 102a. The sound wave is shown to travel along path 205 until it bounces off an inner wall of the collapsible speaker chamber 102a, for example. Once reflected off the inner wall, the sound wave continues to travel along path 205 into the second side chamber 206 until it is reflected by an inner wall of the second side chamber 206, for example. Although not shown, the sound wave continues to travel from the second side chamber 206 back into the collapsible speaker chamber 102a and back toward the diaphragm 203.

While the first side chamber 204, the second side chamber 206, and the collapsible speaker chamber 102a may be open to one another and to the back side of the diaphragm 203 of the speaker driver 201, they may be otherwise closed off (e.g., hermetically sealed) from the rest of the computing device 100 or the outside air. For example, the collapsible speaker chamber 102a may be ultrasonically welded to portions of the first side chamber 204 and the second side chamber 206. In this fashion, the pressure waves produced by the back side of the diaphragm 203 is able to build up within the collective "back chamber" formed by the first and second side chambers 204 and 206 and the collapsible speaker chamber 102a. The ability for such pressure waves to build up in the back chamber increases the audio output quality of the speaker assembly 107a, for example. This is especially true at lower frequencies (e.g., below about 1000 Hz, or about 500 Hz, or about 200 Hz, or about 100 Hz), for example.

As shown in FIG. 2, when the collapsible speaker chamber 102a is in the collapse state, it has a volume 200 that is less than volume 200' of the collapsible speaker chamber 102a in the expanded state. When the collapsible speaker chamber 102a is in the expanded state, it may have a volume 200' that is anywhere between about 5% to about 500% greater than volume 200, or between about 10% to about 200% greater than volume 200, or between about 40% to about 100% greater than volume 200, depending on various implementations.

The increase in the volume 200 of the collapsible speaker chamber 102a enables the audio outputted by the speaker driver 201 to be of higher quality and intensity (e.g., loudness). In particular, the increased volume enables the speaker driver 201 to deliver higher volumes (e.g., intensities) at lower frequencies.

While FIG. 2 shows the collapsible speaker chamber 102a in the collapsed state and in the expanded state, the collapsible speaker chamber 102a may also expand to any number of intermediate states occurring between the collapsed state and the expanded state. For example, if the volume 200' of the collapsible speaker chamber 102a in the expanded state is 100% greater than volume 200 of the collapsible speaker chamber 102a in the collapsed state, then the intermediate states may have volumes that are between 0-100%, exclusive, greater than volume 200.

Figure 3:
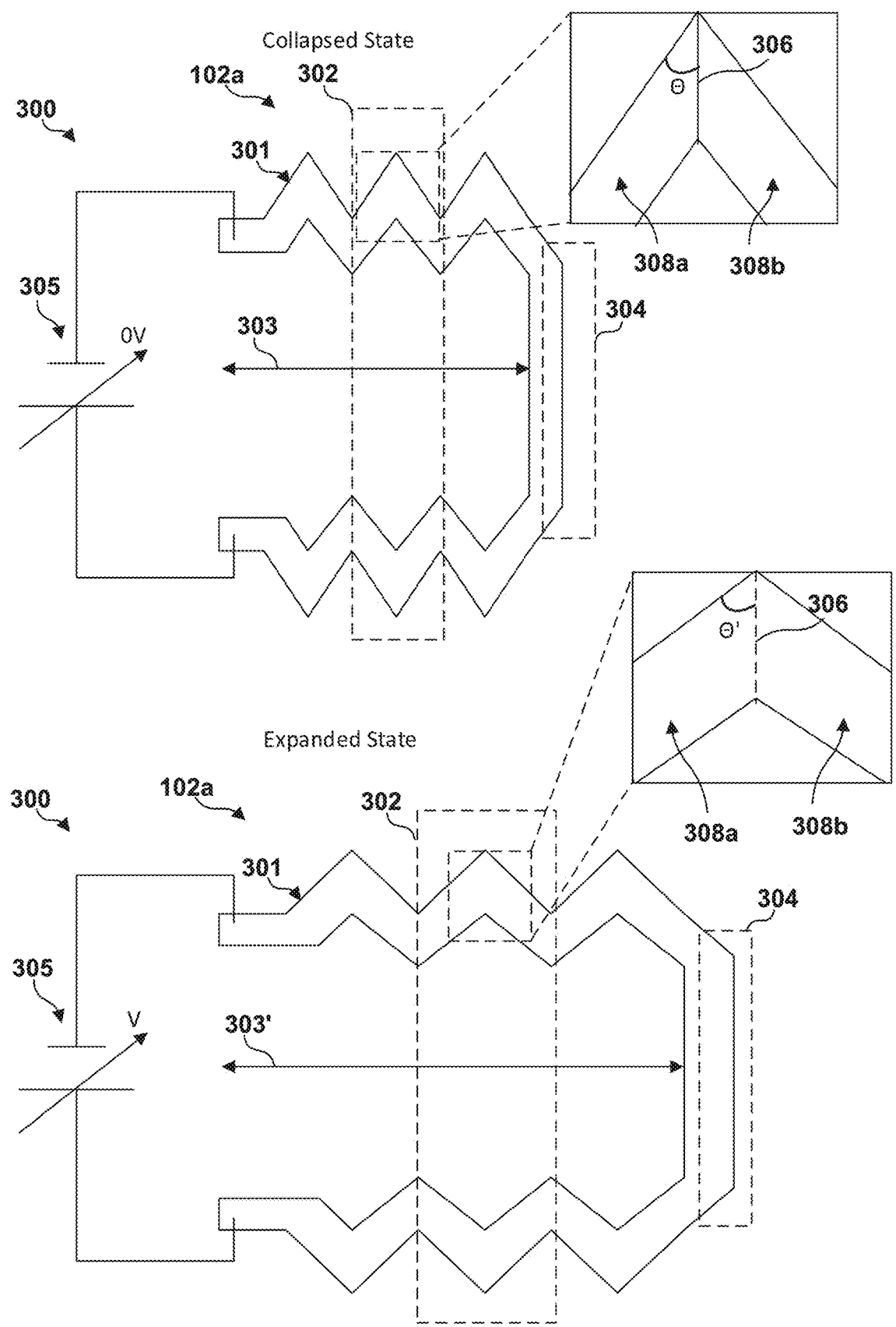
FIG. 3 illustrates a circuit driven mechanism for expanding the collapsible speaker chamber, according to one embodiment.

FIG. 3 illustrates a circuit 300 driven mechanism for expanding the collapsible speaker chamber 102a, according one embodiment. The collapsible speaker chamber 102a is shown to be of a harmonium configuration with a plurality of folding pleats. In the embodiments shown, the collapsible speaker chamber 102a comprises shape memory material 301 that enables the collapsible speaker chamber 102a to achieve a collapsed state and an expanded state. The shape memory material 301 may be a polymer or an alloy or other material that has the ability to return from a deformed state to an original state, for example. In certain examples, the transition from the deformed state to the original state may be induced by an external stimulus such as voltage potential or heat, among others. In the example shown, the collapsed state of the collapsible speaker chamber 102a may correspond to the original shape (e.g., permanent shape) of the shape memory material 301, while the expanded state may correspond to the deformed shape (e.g., temporary shape) of the shape memory material 301. In other embodiments, however, the collapsed state may correspond to the deformed shape, while the expanded state may correspond to the original shape of the shape memory material.

In various embodiments, the shape memory material 301 forms part of a circuit 300, which drives the expansion and collapse of the collapsible speaker chamber 102a. In particular, when voltage 305 is zero, the shape memory material 301 remains in the collapsed state. The collapsible speaker chamber 102a has a height 303 when in the collapsed state. When voltage 305 is non-zero, a current is passed through the shape memory material 301 to cause expansion to the expanded state. The corresponding height 303' of the collapsible speaker chamber 102a in the expanded state is greater than height 303 of the same in the collapsed state.

In certain embodiments, the shape memory material 301 may be blended with carbon nano-powders to enhance the conductivity of the shape memory material 301, for example. Other conductive additives may be blended with the shape memory material 301 to promote its conductance, for example. Additionally, the passing of an electric current through the shape memory polymer 301 may serve to generate heat, which promotes the transition of the shape memory material 301 from the collapsed state to the expanded state.

In various embodiments, the shape memory material 301 may return to the collapsed state after the voltage 305 is no longer non-zero, for example. However, one of the advantages and benefits of using shape memory material 301 its ability to respond to mechanical forces in addition heat or electrical stimulus, for example. In this fashion, the collapsible speaker chamber 102a may be physically manipulated (e.g., pushed in) from the expanded state to the collapsed state. Moreover, the collapsible speaker chamber 102a may be physically manipulated (e.g., pulled out) from the collapsed state to the expanded state, for example.

According to the embodiment shown, the collapsible speaker chamber 102a has a plurality of pleats, including pleat 302. Pleat 302 is shown to include a fold 306 and two abutting flat sections 308a and 308b, for example. The fold 306 provides a rotational degree of freedom for the flat sections 308a and 308b. According to the embodiment shown the flat section 308a forms and angle $\Theta$ with the line of the fold 306, for example. During the transition of the shape memory material 301 from the collapsed state to the expanded state, the shape memory material 301 experiences intra- and intermolecular forces. Those forces macroscopically produce a net force to "unfold" the pleat 302 along the line of the fold 306, for example. The shape memory material 301 of the pleat 302 may be configured to be selectively susceptible to external stimulus (e.g., physical manipulation, heat, or electric current, etc.) along and proximal to the line of the fold 306 and less so or minimally along the flat sections 308a and 308b, for example. For example, the flat sections 308a and 308b, while conducting of electricity, may be prevented from elongating or contracting in response to the current or heat. In this manner, the flat sections 308a and 308b are relatively rigid and maintain their structure. In contrast, the shape memory material 301 along and around the fold 306 may be selectively responsive to external stimulus.

According to the embodiment shown, the voltage 305 causes the pleat 302 to "unfold" along the line of the fold 306. As a result, the angle $\Theta'$ formed by flat section 308a and the line of the fold 306 is greater than angle $\Theta$ formed by the same before expansion, for example. The height 303' associated with the expanded state increases because the flat sections 308a and 308b of pleat 302, as well as those of other pleats, are unfolded.

While the foregoing has referenced folding, unfolding, and the rotational degree of freedom along the line of the fold 306, it should be understood that the fold 306 may be inclusive of a three-dimensional volume of the shape memory material 301 that does not fall along a line. For example, the group of molecules that enable the aforementioned folding along fold 306 may extend some distance from the fold 306 into the flat sections 308a and 308b.

Further, the collapsible speaker chamber 102a is shown to have a flat surface 304 connecting a plurality of sides with pleats. In some embodiments, the flat surface 304 does not include pleats and retains its shape during expansion and collapse of the collapsible speaker chamber 102a. In various embodiments, an obstacle sensor may be disposed on or in the flat surface 304 for sensing external objects or forces. The obstacle sensor may be an obstacle sensor, an infrared (IR) sensor, an ultrasound sensor, or the like. As such, the obstacle sensor may be used to detect obstacles that stand in the way of expansion. In other embodiments, the obstacle sensor may be used to detect an input made by the user to collapse the collapsible speaker chamber 102a. The obstacle sensor may therefore trigger the voltage 305 to be terminated when it senses the input of the user to close the collapsible speaker chamber 102a.

Although FIG. 3 illustrates a collapsible speaker chamber 102a with a series of three pleats, other embodiments may have more or less pleats. For example, in some embodiments, the collapsible speaker chamber 102a may be configured to have anywhere between 1 and 100 pleats, or between 2 and 50 pleats, or between 3 and 10 pleats.

Figure 4:
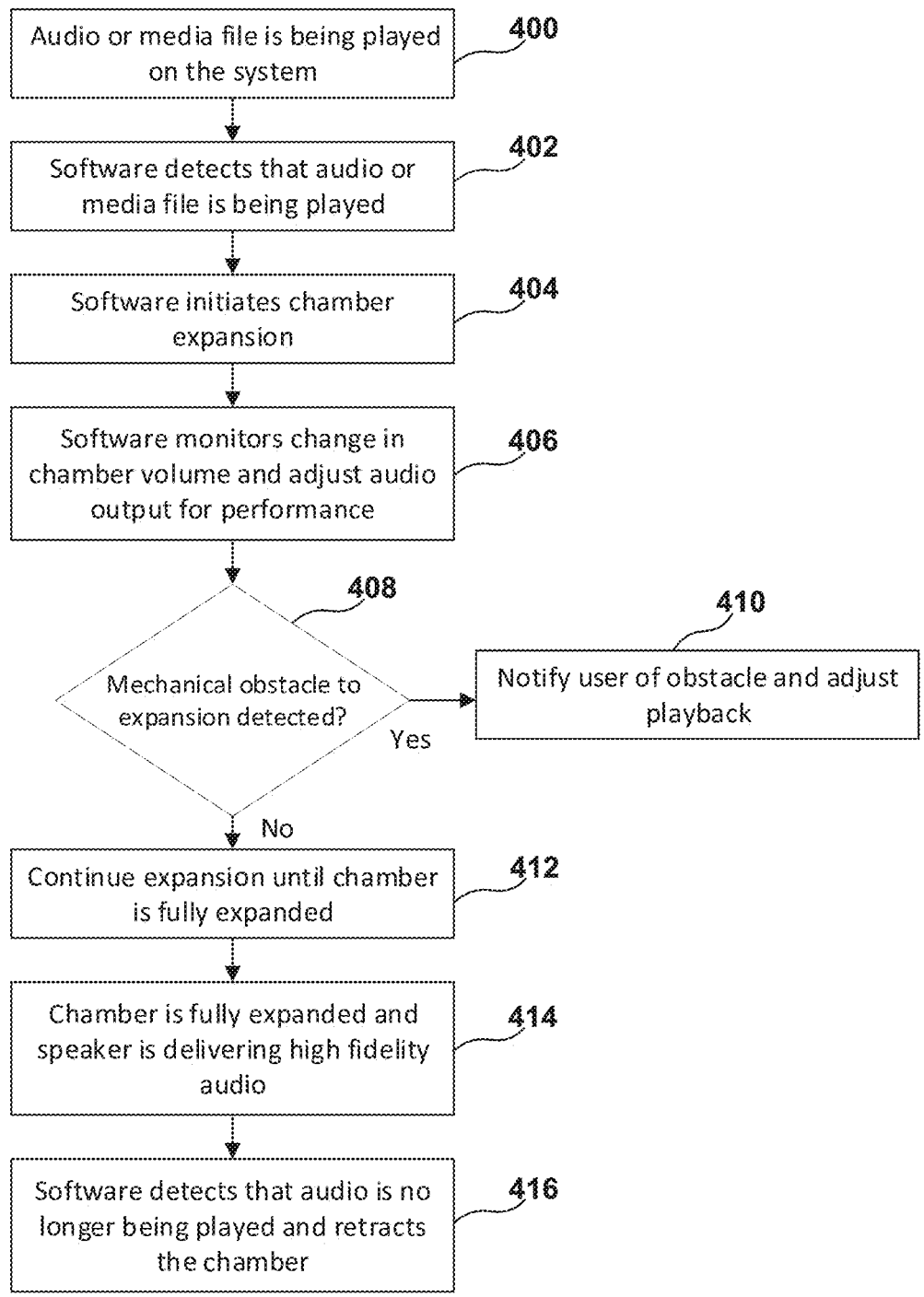
FIG. 4 illustrates a flow chart describing various operations of software-based method for expanding the collapsible speaker chamber, according to one embodiment.

FIG. 4 illustrates a flow chart describing various operations of a software-based method for expanding the collapsible speaker chamber, according to one embodiment. At operation 400, an audio or media file is played on the system. At operation 402, software running on the system detects that the audio or media file is being played. In response, the software initiates expansion of the collapsible speaker chamber at operation 404. For example, the software may instruct the circuit 300 of FIG. 3 to apply voltage 305 to the shape memory material 301. At operation 406, the software monitors change in chamber volume and may begin to adjust audio output for maximizing performance. At operation 406, the software may, for example, determine the volume of the collapsible speaker chamber. Depending on the volume of the chamber, the software may adjust the audio output to optimize performance, for example. For example, the software may adjust the equalization associated with the audio output to optimize performance. At decision 408, the software determines whether a mechanical obstacle to expansion is detected. The mechanical obstacle may be detected via an obstacle sensor disposed on the flat surface 304 of the collapsible speaker chamber 102a. If a mechanical obstacle is detected at decision 408, the user is notified of the obstacle at operation 410 so that the user may remove the obstacle. If no mechanical obstacle is detected at decision 408, the software continues expansion of the collapsible speaker chamber until the collapsible speaker chamber is fully expanded at operation 412, for example. At operation 414, the collapsible speaker chamber is fully expanded and the speaker is delivering high fidelity audio. When the software detects that audio is no longer being played at operation 416, the software may initiate retraction of the collapsible speaker chamber such that collapsible speaker chamber transitions back into the collapsed state.

Figure 5:
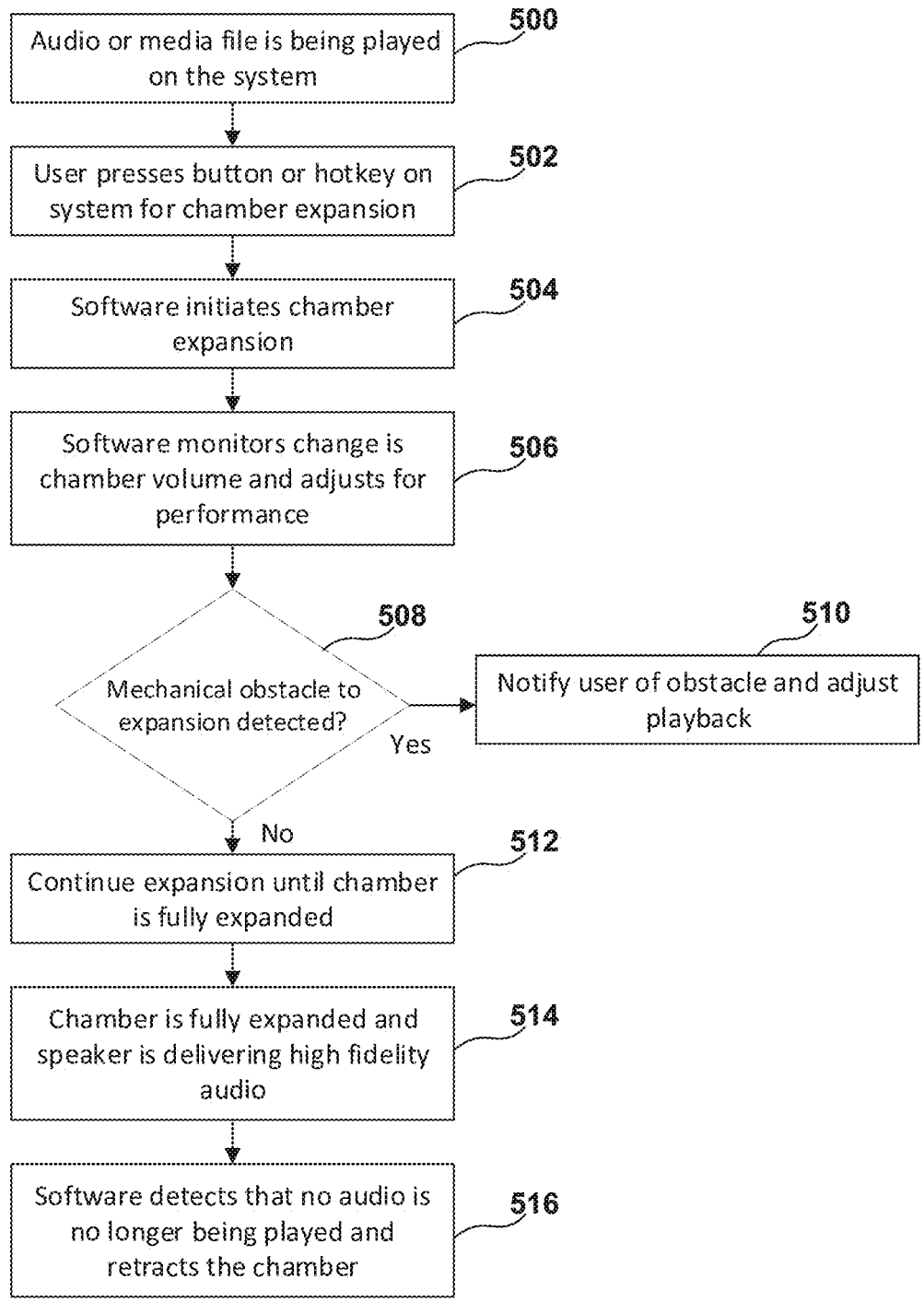
FIG. 5 illustrates a flow chart describing various operations of software-based method for expanding the collapsible speaker chamber occurring in response to user input, according to one embodiment.

FIG. 5 illustrates a flow chart describing various operations of a software-based method for expanding the collapsible speaker chamber occurring in response to user input, according to one embodiment. At operation 500, an audio or media file is played on the system. At operation 502, the system detects that the user has pressed a button or hotkey on the system for expanding the collapsible speaker chamber. In response, the software initiates expansion of the collapsible speaker chamber at operation 504. For example, the software may instruct the circuit 300 of FIG. 3 to apply voltage 305 to the shape memory material 301. At operation 506, the software monitors change in chamber volume and may begin to adjust audio output for maximizing performance. At operation 506, the software may, for example, determine the volume of the collapsible speaker chamber. Depending on the volume of the chamber, the software may adjust the audio output to optimize performance, for example. For example, the software may adjust the equalization associated with the audio output to optimize delivery of the audio output. At decision 508, the software determines whether a mechanical obstacle to expansion is detected. The mechanical obstacle may be detected via an obstacle sensor disposed on the flat surface 304 of the collapsible speaker chamber 102a of FIG. 3. If a mechanical obstacle is detected at decision 508, the user is notified of the obstacle at operation 510 so that the user may remove the obstacle. If no mechanical obstacle is detected at decision 508, the software continues expansion of the collapsible speaker chamber until the collapsible speaker chamber is fully expanded at operation 512, for example. At operation 514, the collapsible speaker chamber is fully expanded and the speaker is delivering high fidelity audio. When the software detects that audio is no longer being played at operation 516, the software may initiate retraction of the collapsible speaker chamber such that collapsible speaker chamber transitions back into the collapsed state. In other embodiments, the user my press a button or hotkey to initiate the retraction of the collapsible speaker chamber.

Figure 6:
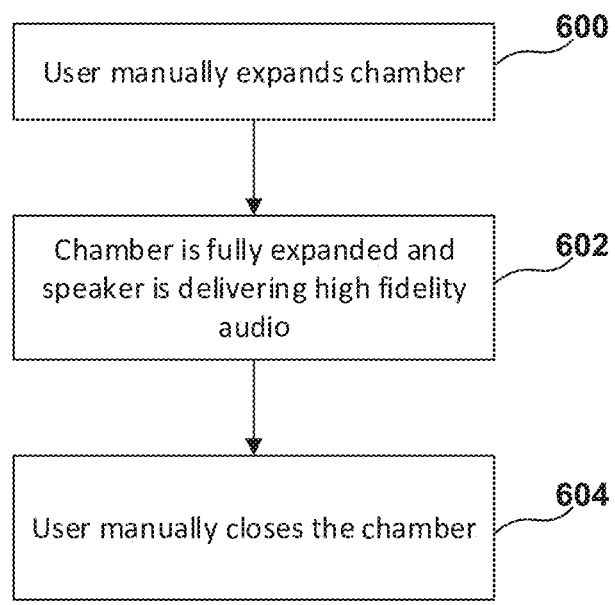
FIG. 6 illustrates an overall flow of a method for manual expansion of the collapsible speaker chamber, according to one embodiment.

FIG. 6 illustrates an overall flow of a method for manual expansion of the collapsible speaker chamber, according to one embodiment. At operation 600, the user manually expands the collapsible speaker chamber by, for example, pulling the collapsible speaker chamber out using their hand. The collapsible speaker chamber may include one or more recessed portions or indents that the user can easily grip. In other embodiments, the collapsible speaker chamber may be expanded using spring force provided by one or more springs. The springs may be miniature springs, piston hinges, rubber springs, metal springs, or pogo pins, or the like. The collapsible speaker chamber may be preloaded with spring force when in the collapsed state, for example.

At operation 602, the collapsible speaker chamber is fully expanded such that the speaker is delivering high fidelity audio. When the user wishes to close the collapsible speaker chamber, they may compress the collapsible speaker chamber such that it collapses into the collapsed state at operation 604. One or more latches may secure the collapsible speaker chamber in the collapse state.

Figure 7:
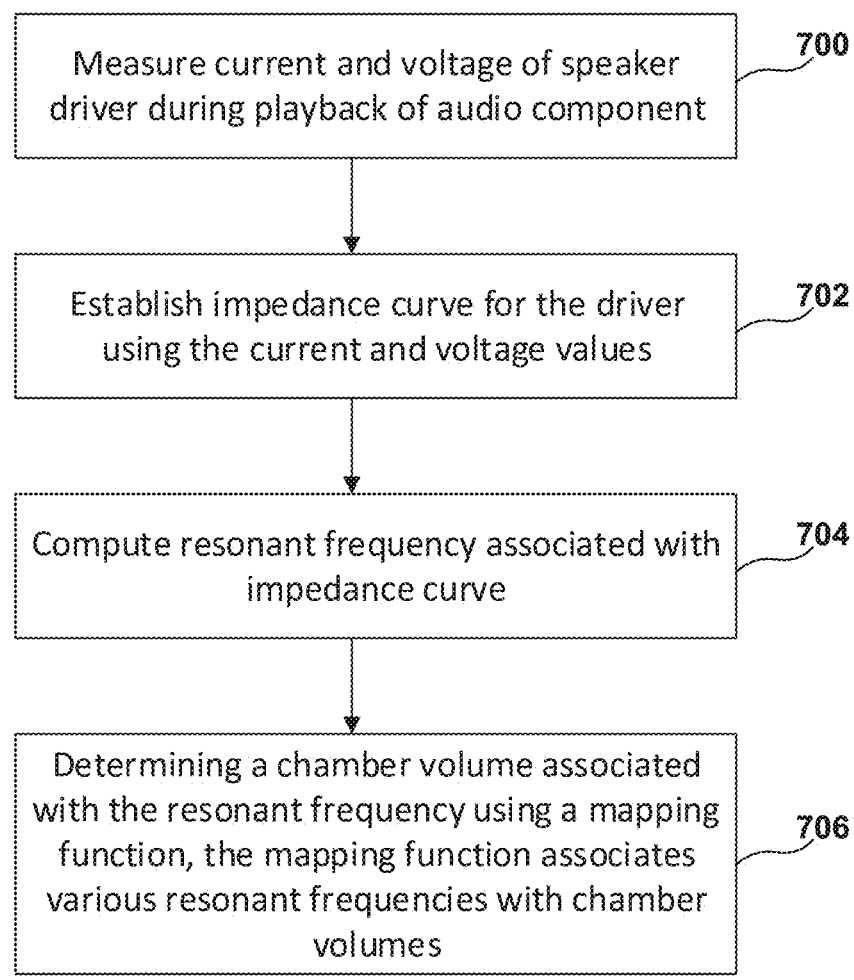
FIG. 7 illustrates the overall flow of a method used to determine the volume of the collapsible speaker chamber when it is in the expanded state or when it is in an intermediate state, according to some embodiments.

FIG. 7 illustrates the overall flow of a method used to determine the volume of the collapsible speaker chamber when it is in the expanded state or when it is in an intermediate state, according to some embodiments. At operation 700, the current and voltage of the speaker are measured during playback of audio while the collapsible speaker chamber is in a certain state (e.g., expanded to some intermediate state). When the audio is being played, a range of frequencies will be delivered by the speaker, for example. An audio component may have frequencies between about 50 Hz to about 20,000 Hz, which will be played by the speaker, for example. As the speaker is delivering the range of frequencies, the current and voltage of the speaker driver is dynamically computed by an amplifier digital signal processing (DSP) for the range of frequencies. Thus, the impedance of the speaker driver may be computed using the current and the voltage across at least a portion of the range of frequencies. At operation 702, an impedance curve is established using the current and voltage values measured at operation 700. The impedance curve may plot the impedance as a function of the frequencies of the audio output that have been played. Even when not all of the frequencies have been played by the speaker, the impedance curve may be approximated from the frequencies that have been played.

According to the embodiment shown, the resonant frequency associated with the impedance curve may be computed at operation 704, for example. The resonant frequency associated with the impedance curve may be found by determining the frequency at which the impedance curve peaks, for example. When the speaker is operating at the resonant frequency, sound waves generated by the speaker driver resonate within the back chamber. This results in the increase of impedance at the resonant frequency.

At operation 706, the chamber volume associated with the resonant frequency is determined. This may be accomplished using a mapping function that associates various resonant frequencies with chamber volumes, for example. The mapping function may be calculated empirically during design or manufacture of the collapsible speaker chamber. For example, the mapping function may comprise a table with pair-wise entries of empirically measured back chamber volumes with the resonant frequency that results from those back-chamber volumes.

Figure 8:
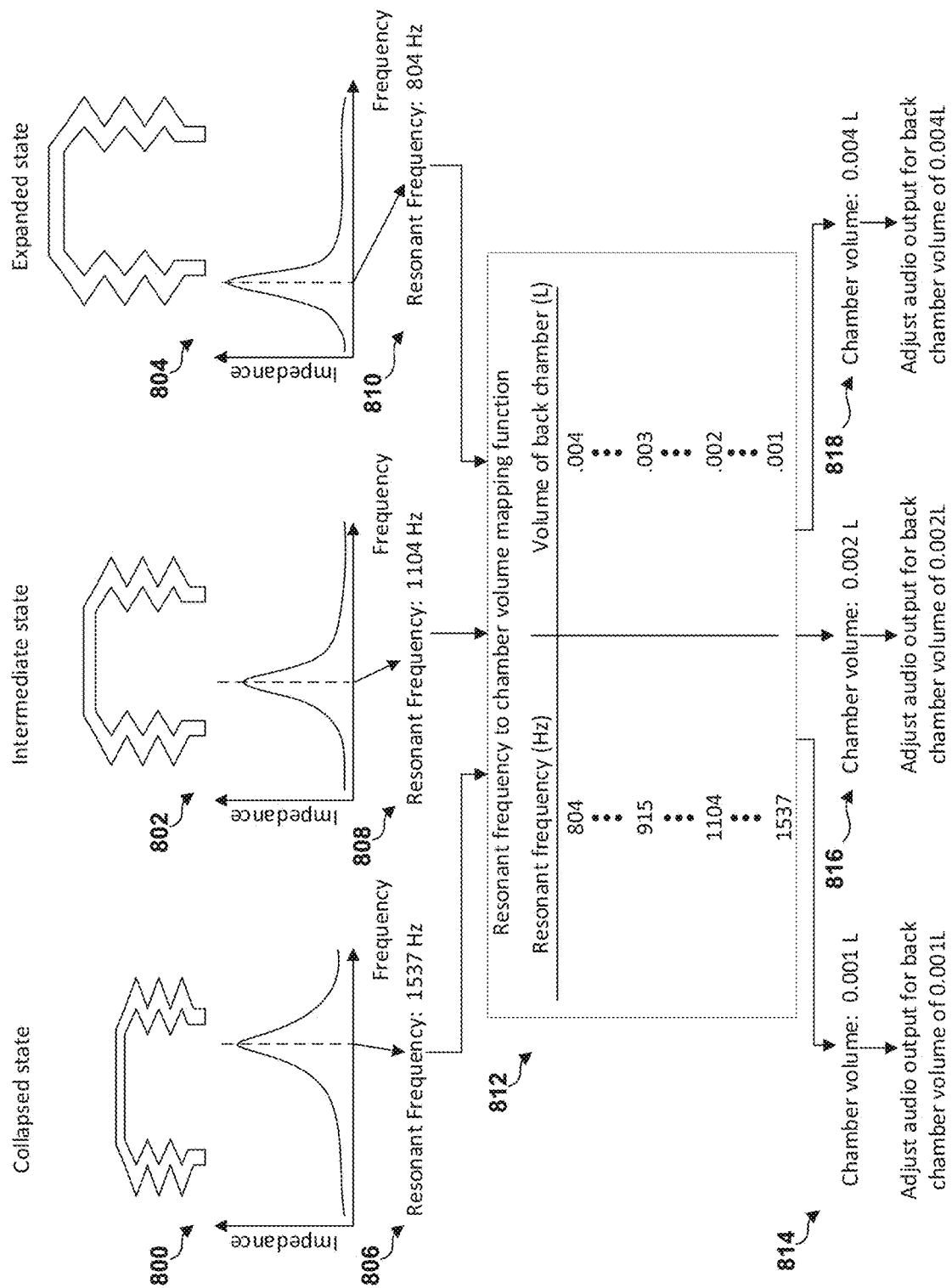
FIG. 8 shows a conceptual diagram describing a method for dynamically computing the back-chamber volume of a collapsible speaker chamber when it is in various states, according to one embodiment.

FIG. 8 shows a conceptual diagram describing a method for dynamically computing the back-chamber volume of a collapsible speaker chamber when it is in various states, according to one embodiment. When the collapsible speaker chamber is in a collapsed state the impedance curve 800 may be established using current and voltage values measured by the amplifier DSP. The resonant frequency 806 is determined to be 1537 Hz by finding the frequency at which the impedance is at maximum. Next, a mapping function 812 is used to determine the back-chamber volume associated with the resonant frequency 806 of 1537 Hz. As noted above, the mapping function may comprise a table that associated various resonant frequencies with empirically determined back chamber volumes. In the example shown, the mapping function may return a chamber volume 814 of 0.001 liters (L) that is associated with the resonant frequency 806 of 1537 Hz. In response to determining that the chamber volume 814 is 0.001 L, the computing device may adjust the audio output accordingly. For example, the computing device may dynamically adjust the equalizer to have a greater or lesser amplitude or response at certain frequencies, for example.

According to the embodiment shown, when the collapsible speaker chamber is expanded into an intermediate state, the impedance curve 802 is established as a result of continual updating. The resonant frequency 808 of 1104 Hz is subsequently computed from the impedance curve 802. Next, the mapping function 812 is used to return a chamber volume 816 of 0.002 L that is associated with the resonant frequency 808 of 1104 Hz. In response to determining that the chamber volume 816 is 0.002 L, the computing device may adjust the audio output accordingly.

According to the embodiment shown, when the collapsible speaker chamber is expanded into the expanded state, the impedance curve 804 is established as a result of continual updating by the amplifier DSP. The resonant frequency 810 of 804 Hz is subsequently computed from the impedance curve 804. Next, the mapping function 812 is used to return a chamber volume 818 of 0.004 L that is associated with the resonant frequency 810 of 804 Hz. In response to determining that the chamber volume 818 is 0.004 L, the computing device may adjust the audio output accordingly.

Figure 9A:
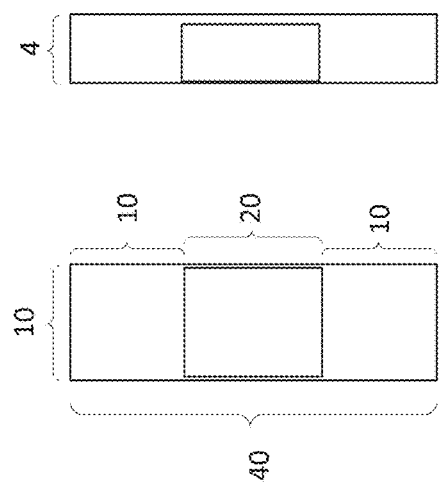
FIGS. 9A and 9B show frequency response curves resulting from a speaker assembly with a collapsible speaker chamber in a collapsed state and an expanded state, respectively, according to one embodiment.
Figure 9A:
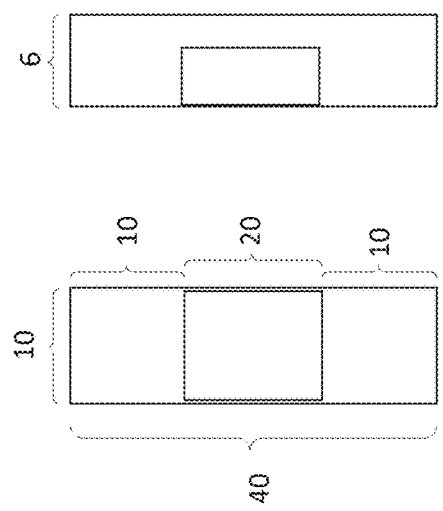
Figure 9A:
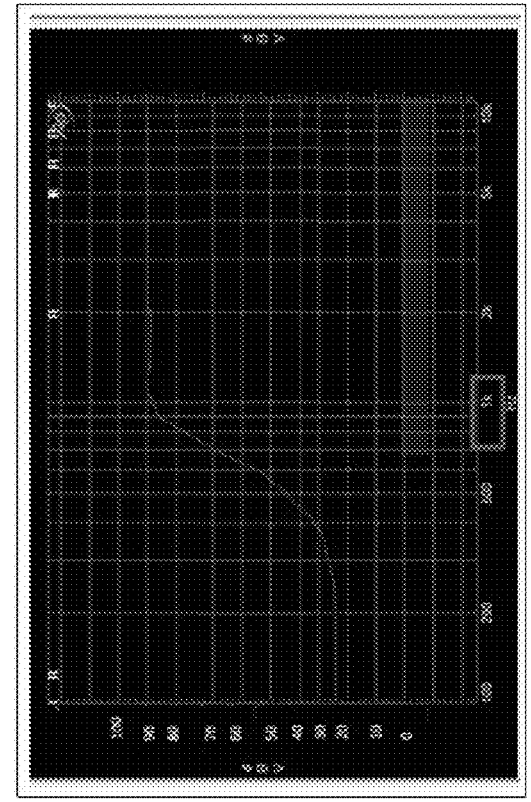
Figure 9B:
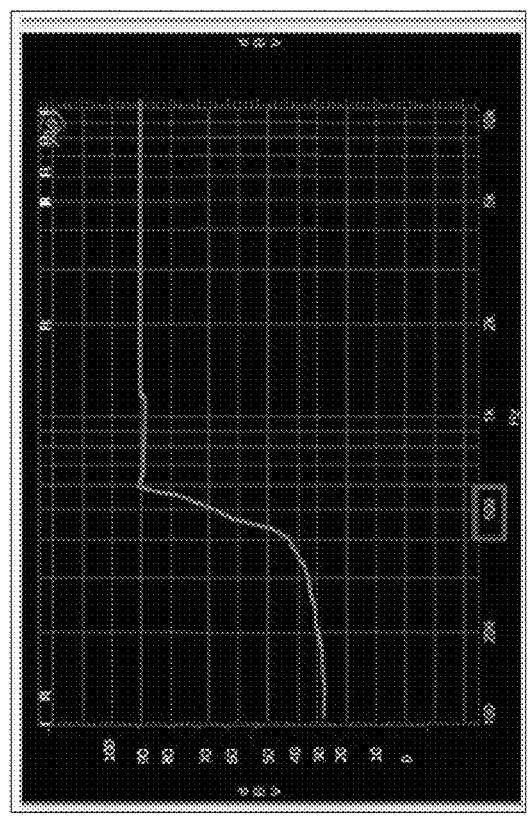

FIGS. 9A and 9B show frequency response curves resulting from a speaker assembly with a collapsible speaker chamber in a collapsed state and an expanded state, respectively, according to one embodiment. In FIG. 9A, the speaker assembly is shown to have a length of 40 mm, a width of 10 mm, and a height of 4 mm when in the collapsed state. The frequency response plot shows that the response (e.g., the volume or intensity of the audio) drops when the frequency is under about 1,000 Hz, for example. This indicates that lower frequency sounds are not delivered with the same intensity or volume as higher frequency sounds, for example.

In FIG. 9B, the speaker assembly is in an expanded state. The speaker assembly has a height of 6 mm as increased from 4 mm for an increase in volume of 50%. The resulting frequency response curve shows that the response does not drop until about 600 Hz. Further, the response of the speaker is maintained at higher levels even under 600 Hz compared to the speaker assembly in the collapsed state. As a result, lower frequency sounds are delivered with higher intensity or volume as compared with the speaker assembly in the collapsed state.

Figure 10:
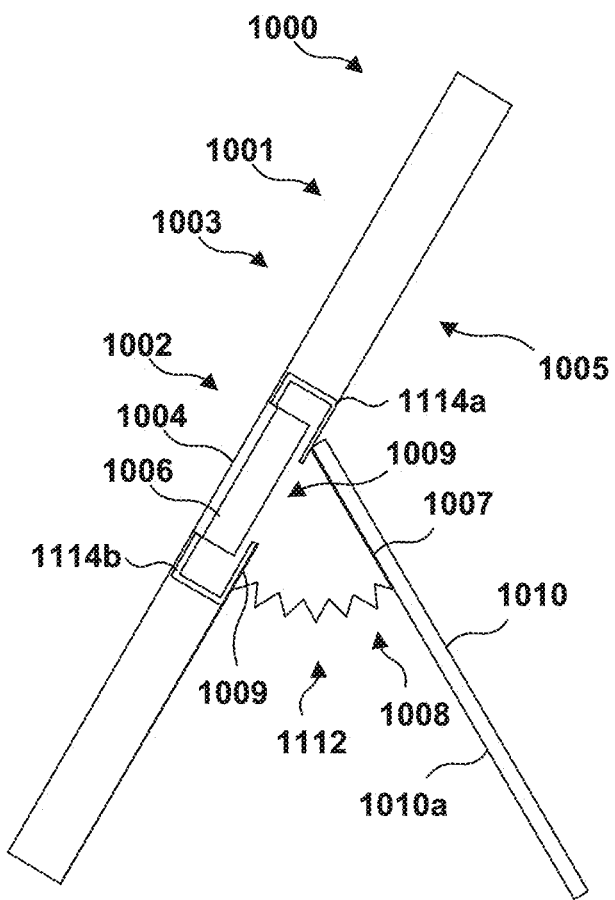
FIG. 10 illustrates a portable computing device having a collapsible speaker chamber configured between a second surface and a stand of the portable computing device, according to one embodiment.

FIG. 10 illustrates a portable computing device 1000 having a collapsible speaker chamber 1112 configured between a second surface 1005 and a stand 1010 of the portable computing device 1000, according to one embodiment. The portable computing device 1000 may be, for example, an AIO device, a tablet, or other device having a component that acts as a stand, for example. In the example shown, the portable computing device 1000 comprises a first surface 1001, a second surface 1005, a user interface 1003 defining a portion of the first surface, and a stand 1010 connected to the portable computing device 1000 proximal to the second surface 1005, for example. The stand 1010 may be coupled to the portable computing device 1000 via a hinge or some other mechanism that enables rotation of the stand 1010. The hinge enables the stand to hinge away from the second surface 1005 for an open position and toward the second surface 1005 for a closed position.

The portable computing device 1000 is shown to include a speaker assembly 1002 comprising a speaker unit 1006, a speaker grille 1004, enclosure portions 1114a and 1114b, and a collapsible speaker chamber 1112. The enclosure portions 1114a and 1114b form parts of an enclosure for the speaker unit 1006, for example. In particular, the enclosure portions 1114a and 1114b enable the back chamber of the speaker unit 1006 to be sealed off from the external environment, for example. There is an opening 1009 that allows air and pressure waves to travel between the enclosure portions 1114a and 1114b and the collapsible speaker chamber 1112. Otherwise, the volume of air shared by the enclosure portions 1114a and 1114b and the collapsible speaker chamber 1112 is sealed from the external atmosphere, for example.

The collapsible speaker chamber 1112 is shown to include a plurality of pleats 1008 that unfold when the collapsible speaker chamber 1112 is in an expanded state and that fold on top of one another when the collapsible speaker chamber 1112 is in a collapsed state, for example. As such, the collapsible speaker chamber 1112 may have a triangular cross section, or a cross section that is in the shape of sector of a circle, for example. In the example shown, the collapsible speaker chamber 1112 includes a flat surface 1007 that is coupled to a first surface 1010a of the stand 1010. As a result, the expansion and collapse of the collapsible speaker chamber 1112 is actuated by the opening and closing of the stand 1010. For example, when the stand 1010 is in an open position (e.g., when it is configured to prop up the portable computing device 1000), the collapsible speaker chamber 1112 is likewise opened to the expanded state. When the stand 1010 is in a closed position (e.g., when it is tucked toward the second surface 1005), the collapsible speaker chamber 1112 is likewise closed into the collapsed state. The stand 1010 may have any number of intermediate states occurring between the closed state and a fully opened state. As result, the collapsible speaker chamber 1112 will likewise have any number of intermediate states existing between the collapsed state and the expanded state, for example.

The collapsible speaker chamber 1112 may also include a flap 1009 that may be coupled to a portion of the second surface 1005. The flap 1009 may serve to increase the volume of the collapsible speaker chamber 1112, for example. The flap 1009 may also serve to form a seal with the portion of the second surface 1005, for example.

Figure 11:
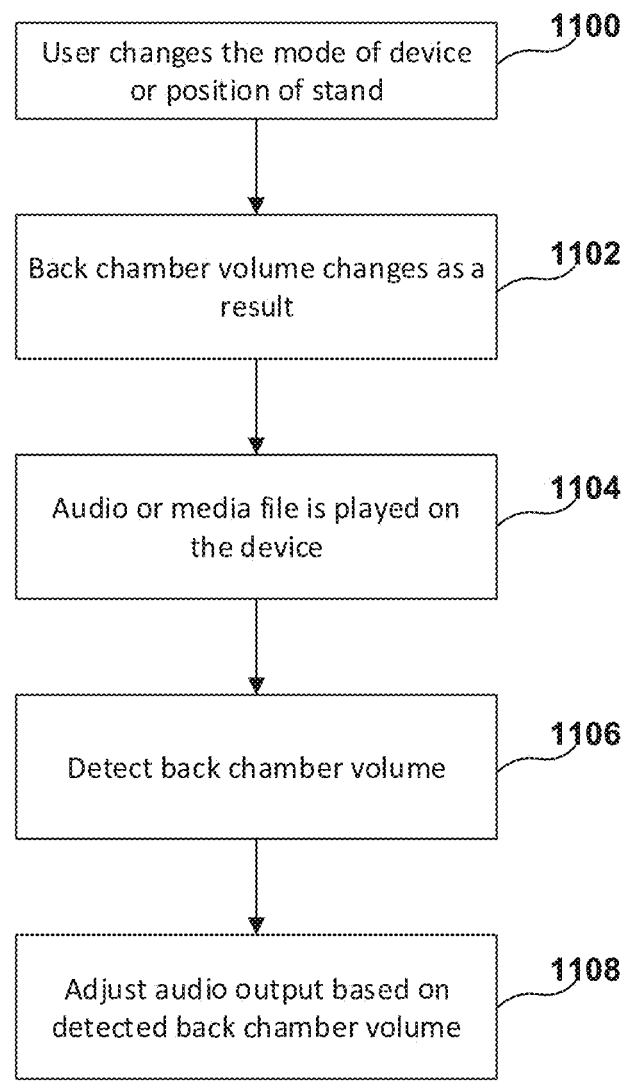
FIG. 11 illustrates the overall flow of a method for determining the back-chamber volume of a collapsible speaker chamber that is coupled to the stand of a portable computing device, according to one embodiment.

FIG. 11 illustrates the overall flow of a method for determining the back-chamber volume of a collapsible speaker chamber that is coupled to the stand of a portable computing device, according to one embodiment. At operation 1100, the user changed the "mode" of the portable computing device or the position of the stand. For example, the user may open the stand from an intermediate state to a more open intermediate state. At operation 1102, the back-chamber volume changes as a result of the user changing the mode of the device or the position of the stand. For example, if the user opens the stand from the intermediate state to a more open intermediate state, then the back-chamber volume would increase accordingly. At operation 1104, an audio or media file is played on the device. Next, the back-chamber volume is detected at operation 1106, for example. The back-chamber volume may be detected using the method described with reference to FIGS. 7 and 8, for example. In response, the audio output may be adjusted according to the detected back chamber volume at operation 1108. For example, the equalization may be automatically performed, for example, to boost the strength of lower ranges of frequencies (e.g., below about 1000 Hz).

Figure 12A:
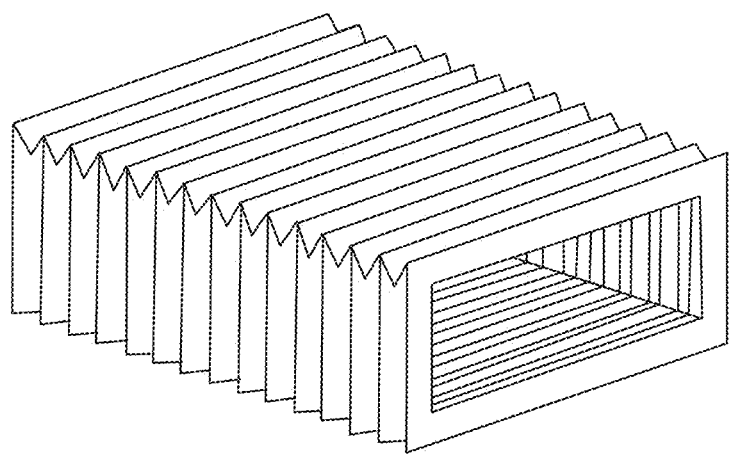
FIGS. 12A and 12B show collapsible speaker chambers that are configured in the harmonium bellow embodiment, as well as accompanying exemplary pleat shapes and arrangements, according to various embodiments.
Figure 12B:
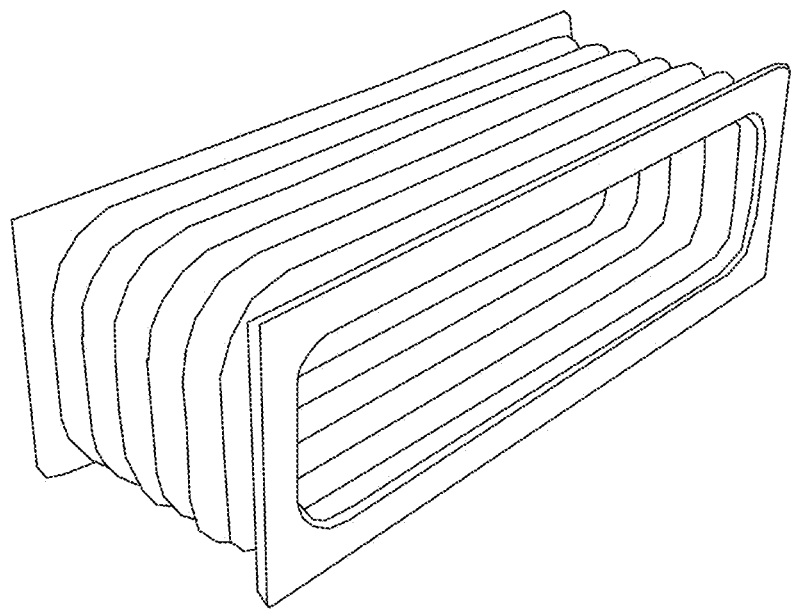

FIGS. 12A and 12B show collapsible speaker chambers that are configured in the harmonium bellow embodiment, as well as accompanying exemplary pleat shapes and arrangements, according to various embodiments. FIG. 12A shows a collapsible speaker chamber configured as a harmonium bellow. The collapsible speaker chamber includes four sides each with a plurality of pleats. Each pleat includes one or more folds that span the length of the pleat, for example. The folds of different sides are distinct from neighboring ones on an adjacent side, for example. FIG. 12B likewise shows a collapsible speaker chamber with a four sides, each of which has a plurality of pleats. A given fold for a pleat is continuous across all four sides, however. For example, the folds in FIG. 12B provide rotational degrees of freedom along at least two axes. In addition to those examples shown in FIG. 12A and FIG. 12B, the collapsible speaker chamber may be configured to have other pleat structures and arrangements not shown in FIGS. 12A and 12B.

Hardware

Figure 13:
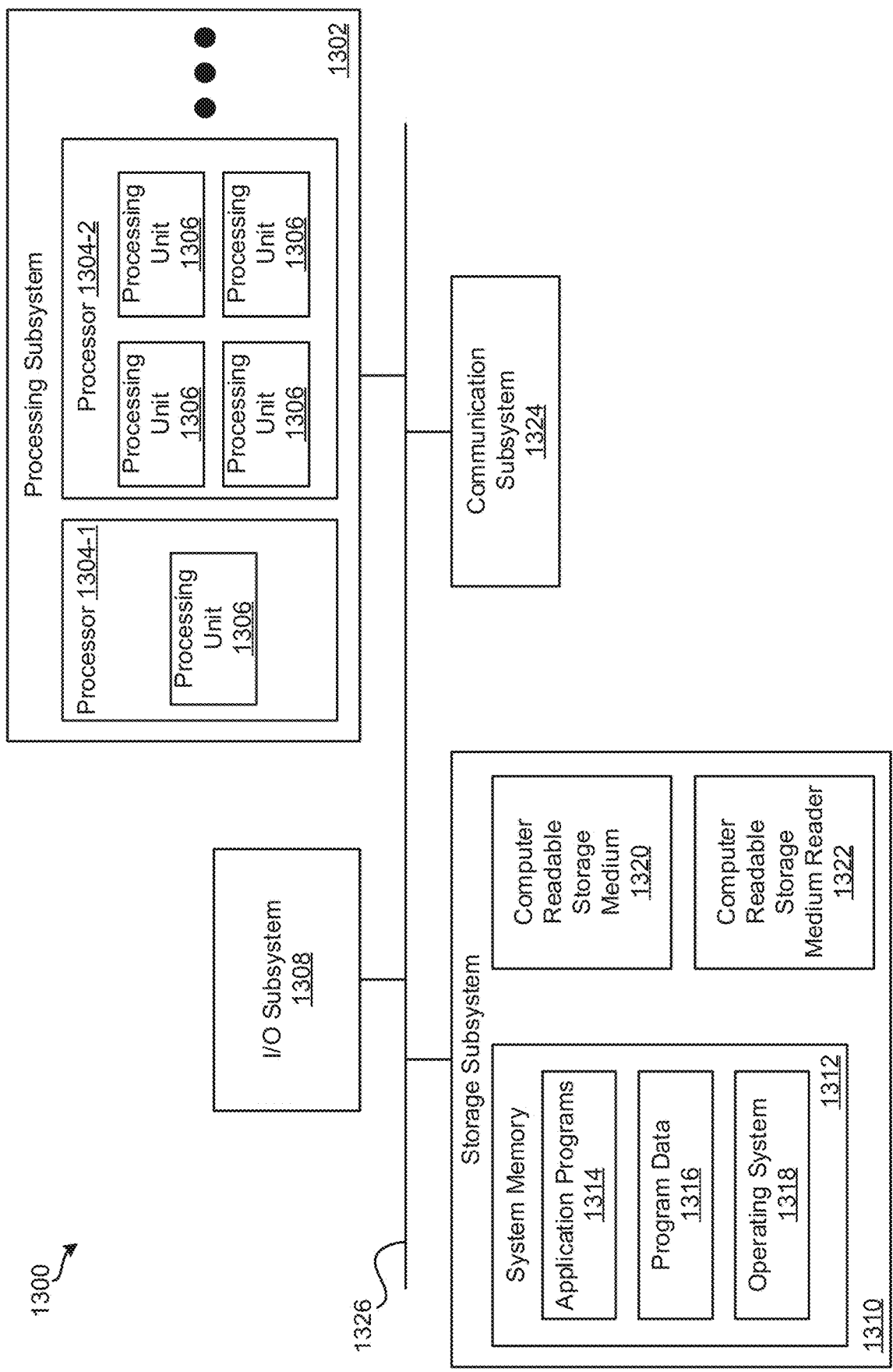
FIG. 13 illustrates an exemplary computer system for implementing various embodiments described above.

FIG. 13 illustrates an exemplary computer system 1300 for implementing various embodiments described above. For example, computer system 1300 may be used to implement computing device 100 or portable computing device 1000. Computer system 1300 may be a desktop computer, a laptop, a server computer, a tablet, a phone, a smart TV, or any other type of computer system or combination thereof. Computer system 1300 can implement many of the operations, methods, and/or processes described above. As shown in FIG. 13, computer system 1300 includes processing subsystem 1302, which communicates, via bus subsystem 1326, with input/output (I/O) subsystem 1308, storage subsystem 1310 and communication subsystem 1324.

Bus subsystem 1326 is configured to facilitate communication among the various components and subsystems of computer system 1300. While bus subsystem 1326 is illustrated in FIG. 13 as a single bus, one of ordinary skill in the art will understand that bus subsystem 1326 may be implemented as multiple buses. Bus subsystem 1326 may be any of several types of bus structures (e.g., a memory bus or memory controller, a peripheral bus, a local bus, etc.) using any of a variety of bus architectures. Examples of bus architectures may include an Industry Standard Architecture (ISA) bus, a Micro Channel Architecture (MCA) bus, an Enhanced ISA (EISA) bus, a Video Electronics Standards Association (VESA) local bus, a Peripheral Component Interconnect (PCI) bus, a Universal Serial Bus (USB), etc.

Processing subsystem 1302, which can be implemented as one or more integrated circuits (e.g., a conventional microprocessor or microcontroller), controls the operation of computer system 1300. Processing subsystem 1302 may include one or more processors 1304. Each processor 1304 may include one processing unit 1306 (e.g., a single core processor such as processor 1304-1) or several processing units 1306 (e.g., a multicore processor such as processor 1304-2). In some embodiments, processors 1304 of processing subsystem 1302 may be implemented as independent processors while, in other embodiments, processors 1304 of processing subsystem 1302 may be implemented as multiple processors integrate into a single chip or multiple chips. Still, in some embodiments, processors 1304 of processing subsystem 1302 may be implemented as a combination of independent processors and multiple processors integrated into a single chip or multiple chips.

In some embodiments, processing subsystem 1302 can execute a variety of programs or processes in response to program code and can maintain multiple concurrently executing programs or processes. At any given time, some or all of the program code to be executed can reside in processing subsystem 1302 and/or in storage subsystem 1310. Through suitable programming, processing subsystem 1302 can provide various functionalities, such as the functionalities described above by reference to FIGS. 4, 5, 7 and 11, etc.

I/O subsystem 1308 may include any number of user interface input devices and/or user interface output devices. User interface input devices may include a keyboard, pointing devices (e.g., a mouse, a trackball, etc.), a touchpad, a touch screen incorporated into a display, a scroll wheel, a click wheel, a dial, a button, a switch, a keypad, audio input devices with voice recognition systems, microphones, image/video capture devices (e.g., webcams, image scanners, barcode readers, etc.), motion sensing devices, gesture recognition devices, eye gesture (e.g., blinking) recognition devices, biometric input devices, and/or any other types of input devices.

User interface output devices may include visual output devices (e.g., a display subsystem, indicator lights, etc.), audio output devices (e.g., speakers, headphones, etc.), etc. Examples of a display subsystem may include a cathode ray tube (CRT), a flat-panel device (e.g., a liquid crystal display (LCD), a plasma display, etc.), a projection device, a touch screen, and/or any other types of devices and mechanisms for outputting information from computer system 1300 to a user or another device (e.g., a printer).

As illustrated in FIG. 13, storage subsystem 1310 includes system memory 1312, computer-readable storage medium 1320, and computer-readable storage medium reader 1322. System memory 1312 may be configured to store software in the form of program instructions that are loadable and executable by processing subsystem 1302 as well as data generated during the execution of program instructions. In some embodiments, system memory 1312 may include volatile memory (e.g., random access memory (RAM)) and/or non-volatile memory (e.g., read-only memory (ROM), programmable read-only memory (PROM), erasable programmable read-only memory (EPROM), electrically erasable programmable read-only memory (EEPROM), flash memory, etc.). System memory 1312 may include different types of memory, such as static random-access memory (SRAM) and/or dynamic random-access memory (DRAM). System memory 1312 may include a basic input/output system (BIOS), in some embodiments, that is configured to store basic routines to facilitate transferring information between elements within computer system 1300 (e.g., during start-up). Such a BIOS may be stored in ROM (e.g., a ROM chip), flash memory, or any other type of memory that may be configured to store the BIOS.

As shown in FIG. 13, system memory 1312 includes application programs 1314, program data 1316, and operating system (OS) 1318. OS 1318 may be one of various versions of Microsoft Windows, Apple Mac OS, Apple OS X, Apple macOS, and/or Linux operating systems, a variety of commercially-available UNIX or UNIX-like operating systems (including without limitation the variety of GNU/Linux operating systems, the Google Chrome® OS, and the like) and/or mobile operating systems such as Apple iOS, Windows Phone, Windows Mobile, Android, BlackBerry OS, Blackberry 10, and Palm OS, WebOS operating systems.

Computer-readable storage medium 1320 may be a non-transitory computer-readable medium configured to store software (e.g., programs, code modules, data constructs, instructions, etc.). Many of the components and/or processes described above may be implemented as software that when executed by a processor or processing unit (e.g., a processor or processing unit of processing subsystem 1302) performs the operations of such components and/or processes. Storage subsystem 1310 may also store data used for, or generated during, the execution of the software.

Storage subsystem 1310 may also include computer-readable storage medium reader 1322 that is configured to communicate with computer-readable storage medium 1320. Together and, optionally, in combination with system memory 1312, computer-readable storage medium 1320 may comprehensively represent remote, local, fixed, and/or removable storage devices plus storage media for temporarily and/or more permanently containing, storing, transmitting, and retrieving computer-readable information.

Computer-readable storage medium 1320 may be any appropriate media known or used in the art, including storage media such as volatile, non-volatile, removable, non-removable media implemented in any method or technology for storage and/or transmission of information. Examples of such storage media includes RAM, ROM, EEPROM, flash memory or other memory technology, compact disc read-only memory (CD-ROM), digital versatile disk (DVD), Blu-ray Disc (BD), magnetic cassettes, magnetic tape, magnetic disk storage (e.g., hard disk drives), Zip drives, solid-state drives (SSD), flash memory card (e.g., secure digital (SD) cards, CompactFlash cards, etc.), USB flash drives, or any other type of computer-readable storage media or device.

Communication subsystem 1324 serves as an interface for receiving data from, and transmitting data to, other devices, computer systems, and networks. For example, communication subsystem 1324 may allow computer system 1300 to connect to one or more devices via a network (e.g., a personal area network (PAN), a local area network (LAN), a storage area network (SAN), a campus area network (CAN), a metropolitan area network (MAN), a wide area network (WAN), a global area network (GAN), an intranet, the Internet, a network of any number of different types of networks, etc.). Communication subsystem 1324 can include any number of different communication components. Examples of such components may include radio frequency (RF) transceiver components for accessing wireless voice and/or data networks (e.g., using cellular technologies such as 2G, 3G, 4G, 5G, etc., wireless data technologies such as Wi-Fi, Bluetooth, ZigBee, etc., or any combination thereof), global positioning system (GPS) receiver components, and/or other components. In some embodiments, communication subsystem 1324 may provide components configured for wired communication (e.g., Ethernet) in addition to or instead of components configured for wireless communication.

One of ordinary skill in the art will realize that the architecture shown in FIG. 13 is only an example architecture of computer system 1300, and that computer system 1300 may have additional or fewer components than shown, or a different configuration of components. The various components shown in FIG. 13 may be implemented in hardware, software, firmware or any combination thereof, including one or more signal processing and/or application specific integrated circuits.

FURTHER EXAMPLES

Each of these non-limiting examples may stand on its own or may be combined in various permutations or combinations with one or more of the other examples.

Example 1 is a portable computing device comprising: a first surface comprising at least one user interface; a second surface opposite the first surface; at least one speaker port in the first surface; a collapsible speaker chamber configured on the second surface opposite the at least one speaker port; and a speaker configured in the portable computing device between the speaker port and the collapsible speaker chamber.

In Example 2, the subject matter of Example 1 optionally includes wherein the portable computing device has a form factor when the collapsible speaker chamber is in a collapsed state, and wherein, in an expanded state, the collapsible speaker chamber expands outside the form factor of the portable computing device.

In Example 3, the subject matter of Examples 1-2 optionally includes wherein the at least one user interface includes a display or keyboard.

In Example 4, the subject matter of Examples 1-3 optionally includes wherein the portable computing device is a laptop computer, or a tablet, or a phablet, or a portable phone.

In Example 5, the subject matter of Examples 1-4 optionally includes wherein the collapsible speaker chamber comprises a flat surface and a plurality of sides configured as a harmonium.

In Example 6, the subject matter of Examples 1-5 optionally includes wherein the flat surface is coupled to a stand of the portable computing device.

In Example 7, the subject matter of Examples 1-6 optionally includes wherein the collapsible speaker chamber has a triangular cross section when the stand is in an open position and wherein collapsible speaker chamber has three sides configured as said harmonium.

In Example 8, the subject matter of Examples 1-7 optionally includes wherein closing the stand collapses the collapsible speaker chamber into a collapsed state and wherein opening the stand expands the collapsible speaker chamber into an expanded state.

In Example 9, the subject matter of Examples 1-8 optionally includes further comprising: a circuit configured to supply a voltage through the collapsible speaker chamber for the collapsible speaker chamber to expand into an expanded state and configured to terminate the voltage through the collapsible speaker chamber for the collapsible speaker chamber to collapse into a collapsed state.

In Example 10, the subject matter of Examples 1-9 optionally includes wherein the collapsible speaker chamber comprises a shape memory material, the shape memory material having a permanent shape corresponding to a collapsed state of the collapsible speaker chamber and having a temporary state corresponding to an expanded state of the collapsible speaker chamber.

In Example 11, the subject matter of Examples 1-10 optionally includes wherein the shape memory material transitions into the temporary state when a voltage is applied to the shape memory material, and wherein the shape memory material transitions back into the permanent shape when the voltage is no longer applied to the shape memory material.

In Example 12, the subject matter of Examples 1-11 optionally includes further comprising: one or more actuators coupled to the collapsible speaker chamber for expanding the collapsible speaker chamber to an expanded state.

In Example 13, the subject matter of Examples 1-12 optionally includes wherein the one or more actuators are piston hinges, rubber springs, metal springs, or pogo pins.

Example 14 is a method for increasing a chamber volume of a collapsible speaker chamber of a speaker assembly of a portable computing device, comprising: detecting that an audio component is being played on the portable computing device; expanding, in response to said detecting, the collapsible speaker chamber to an expanded state for increasing the chamber volume of the collapsible speaker chamber; delivering, by the speaker assembly, the audio component while the collapsible speaker chamber is in the expanded state.

In Example 15, the subject matter of Example 14 optionally includes wherein said expanding the collapsible speaker chamber comprises: applying a voltage to shape memory material that the collapsible speaker chamber comprises, wherein said applying the voltage is configured to deform the shape memory material for said expanding the chamber.

In Example 16, the subject matter of Examples 14-15 optionally includes further comprising: detecting that an obstacle is impeding said expanding the collapsible speaker chamber; discontinuing, in response to said detecting the obstacle, said expanding the collapsible speaker chamber; and sending a notification to a user of the portable computing device of the obstacle.

In Example 17, the subject matter of Examples 14-16 optionally includes further comprising: determining the chamber volume of the collapsible speaker chamber; and adjusting an equalization for said delivering the audio component.

In Example 18, the subject matter of Examples 14-17 optionally includes wherein said determining the chamber volume comprises: measuring current values and voltage values of a speaker driver of the speaker assembly while the collapsible speaker chamber is at a particular chamber volume and during; establishing an impedance curve for the speaker driver for the particular chamber volume using the current values and voltage values; computing a resonant frequency associated with the impedance curve; and mapping the resonant frequency to the particular chamber volume for determining the particular chamber volume using a mapping function, wherein the mapping function relates resonant frequencies to respective chamber volumes.

Example 19 is a portable computing device, comprising: a first surface comprising at least one user interface; a second surface opposite the first surface; a stand coupled to the second surface, the stand hinges away from the second surface; a speaker port in the first surface; a collapsible speaker chamber configured on the second surface opposite the at least one speaker port, the collapsible speaker chamber comprises a flat surface coupled to the stand; and a speaker configured in the portable computing device between the speaker port and the collapsible speaker chamber.

In Example 20, the subject matter of Example 19 optionally includes is a non-transitory machine-readable medium having executable instructions to cause one or more processing units to perform a method to determine a three-dimensional position of an object, the method comprising: detecting, on a surface comprising an optical sensor, an optical signal emitted from an object, the optical signal forming a geometric pattern on the surface; and determining, based on the geometric pattern formed on the surface, the three-dimensional position of the object relative to the surface.

Example 21 is at least one machine-readable medium including instructions for operation of a computing system, which when executed by a machine, cause the machine to perform operations of any of the methods of Examples 14-18.

Example 22 is an apparatus comprising means for performing any of the methods of Examples 14-18.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A portable computing device comprising:
    a first surface;
    a second surface opposite the first surface, together with the first surface defining a space between the first and second surfaces;
    at least one speaker port in the first surface;
    a collapsible speaker chamber configured in a portion of the space between the first and second surfaces, the collapsible speaker chamber having a collapsed state and an expanded state, wherein in the collapsed state, the collapsible speaker chamber is entirely within the space between the first and second surfaces, and wherein in the expanded state, at least a portion of the collapsible speaker chamber protrudes outside the space between the first and second surfaces, beyond and through a portion of the second surface opposite the at least one speaker port; and
    a speaker configured in the space between the first and second surfaces between the speaker port and the collapsible speaker chamber.

2. The portable computing device of claim 1, wherein the first surface comprises at least one user interface, the at least one user interface includes a display or keyboard.

3. The portable computing device of claim 1, wherein the portable computing device is a laptop computer, or a tablet, or a phablet, or a portable phone.

4. The portable computing device of claim 1, wherein the collapsible speaker chamber comprises a plurality of sides configured as a harmonium.

5. The portable computing device of claim 1, further comprising:
    one or more actuators coupled to the collapsible speaker chamber for expanding the collapsible speaker chamber to the expanded state.

6. The portable computing device of claim 5, wherein the one or more actuators are piston hinges, rubber springs, metal springs, or pogo pins.

7. The portable computing device comprising:
    a first surface;
    a second surface opposite the first surface, together with the first surface defining a space between the first and second surfaces;

at least one speaker port in the first surface;
a swivelable stand coupled to the second surface, swivelable between a closed position and an open position;
a collapsible speaker chamber configured to couple between the second surface and an inner surface of the swivelable stand, the collapsible speaker chamber having a collapsed state and an expanded state, wherein the collapsible speaker chamber is in the collapsed state when the swivelable stand is in the closed position, and wherein the collapsible speaker chamber is in the expanded state when the swivelable stand is in the open position; and
a speaker configured in the space between the first and second surfaces between the speaker port and the collapsible speaker chamber.

8. The portable computing device of claim 7, wherein the collapsible speaker chamber has a triangular cross section when the stand is in the open position, with a side coupling the second surface and the swivelable stand configured as a harmonium.

9. A portable computing device comprising:
a first surface;
a second surface opposite the first surface;
at least one speaker port in the first surface;
a collapsible speaker chamber configured on the second surface opposite the at least one speaker port;
a speaker configured in the portable computing device between the speaker port and the collapsible speaker chamber; and
a circuit configured to supply a voltage through the collapsible speaker chamber for the collapsible speaker chamber to expand into an expanded state and configured to terminate the voltage through the collapsible speaker chamber for the collapsible speaker chamber to collapse into a collapsed state.

10. The portable computing device of claim 9, wherein the collapsible speaker chamber comprises a shape memory material, the shape memory material having a permanent shape corresponding to a collapsed state of the collapsible speaker chamber and having a temporary state corresponding to an expanded state of the collapsible speaker chamber.

11. The portable computing device of claim 10, wherein the shape memory material transitions into the temporary state when a voltage is applied to the shape memory material, and wherein the shape memory material transitions back into the permanent shape when the voltage is no longer applied to the shape memory material.

12. A portable computing device, comprising:
a first surface comprising at least one user interface;
a second surface opposite the first surface;
a stand coupled to the second surface, the stand hinges away from the second surface;
a speaker port in the first surface;
a collapsible speaker chamber configured on the second surface opposite the speaker port, the collapsible speaker chamber comprises a flat surface coupled to the stand; and
a speaker configured in the portable computing device between the speaker port and the collapsible speaker chamber.

13. The portable computing device of claim 12, wherein the collapsible speaker chamber is expanded when the stand hinges away from the second surface and wherein the collapsible speaker chamber is collapsed when the stand hinges toward the second surface.

* * * * *